United States Patent [19]

Malaviva

[11] 4,323,986
[45] Apr. 6, 1982

[54] ELECTRONIC STORAGE ARRAY HAVING DC STABLE CONDUCTIVITY MODULATED STORAGE CELLS

[75] Inventor: Shashi D. Malaviva, Fishkill, N.Y.

[73] Assignee: International Business Machines Corporation, Armonk, N.Y.

[21] Appl. No.: 164,646

[22] Filed: Jun. 30, 1980

[51] Int. Cl.³ .............................................. G11C 11/40
[52] U.S. Cl. .................................... 365/174; 365/177; 357/43
[58] Field of Search ............... 365/174, 189, 230, 177, 365/184, 185, 222; 357/43

[56] References Cited

U.S. PATENT DOCUMENTS

| | | | |
|---|---|---|---|
| 4,070,653 | 1/1978 | Ray et al. | 365/222 |
| 4,092,735 | 5/1978 | McElroy | 365/183 |
| 4,142,111 | 2/1979 | McElroy | 365/178 |
| 4,142,112 | 2/1979 | Kroger | 365/186 |

OTHER PUBLICATIONS

"An Improved Gambit Device Structure", Baliga, *IEEE Transactions on Electron Devices*, vol. ED-25, Dec. 1978, pp. 1411-1412.
"The Negit: A Surface Control Negative Impedance Transistor", Thomas, *IEEE Transactions on Electron Devices*, vol. ED-24, No. 8, Aug. 1977, pp. 1070-1076.

*Primary Examiner*—Terrell W. Fears
*Attorney, Agent, or Firm*—Theodore E. Galanthay

[57] ABSTRACT

This is an electronic storage array used in data processing systems for the storage of information in the form of binary bits. The storage is fabricated in integrated circuit form, typically on a semiconductor chip, each storage cell being contained within a single isolated zone formed in the semiconductor chip. Each storage cell is DC stable and operates on a conductivity modulation principle, i.e. a cell conducts when it stores a binary "1" and the conductive state is maintained by conductivity modulation of an element of the cell, and the cell is non-conducting when storing a binary "0". In its most basic form, each cell includes at least two resistors formed in series in a P type semiconductor region. At least one of the resistors, formed in a lightly doped portion of the P type region, is a variable resistor having both high and low values of resistance. The high value of resistance is changed to a low value of resistance by injecting electrons from a proximate N type semiconductor region. The low value of resistance is then maintained by the current conducted through the storage cell during standby.

14 Claims, 12 Drawing Figures

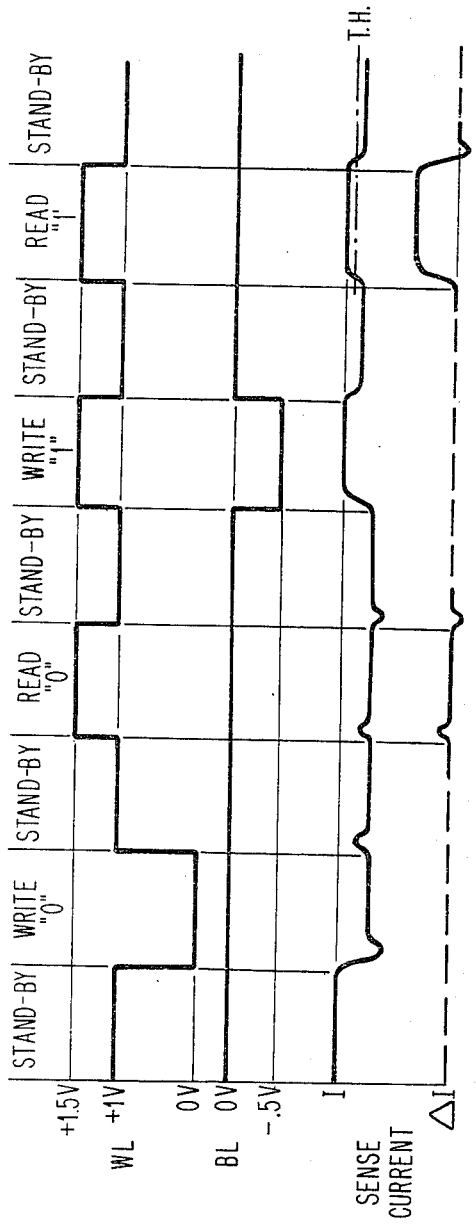
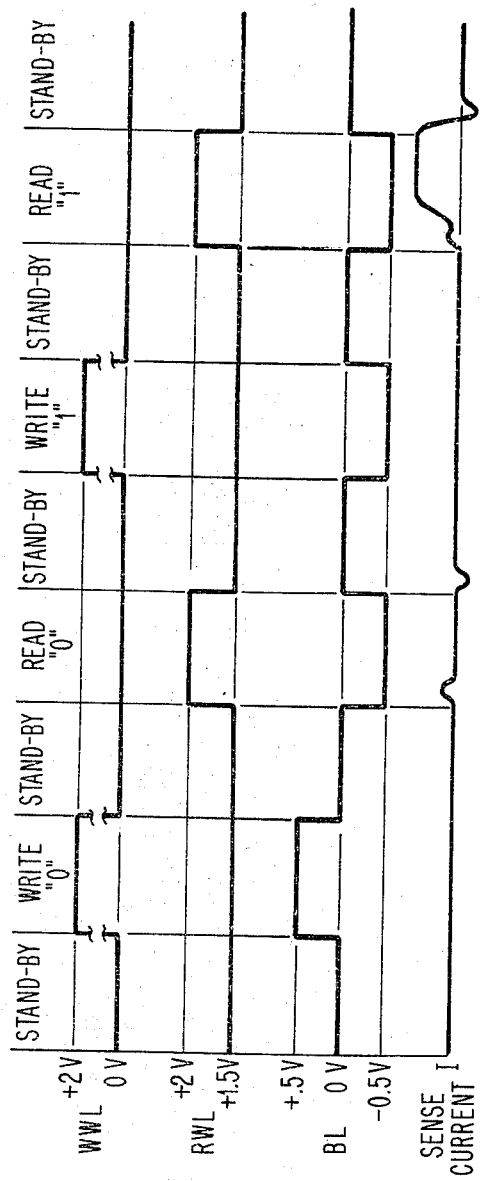

ELECTRONIC STORAGE ARRAY HAVING DC STABLE CONDUCTIVITY MODULATED STORAGE CELLS

DESCRIPTION

1. Technical Field

This invention relates to an electronic data storage array having DC stable conductivity modulated memory cells formed on an integrated circuit substrate.

It is an object of the present invention to provide an electronic data storage array having improved memory cells on an integrated circuit substrate with the advantageous features of DC stability and nondestructive read-out.

Another object of this invention is to provide improved integrated storage cells wherein each cell is contained in a single isolation zone providing high density storage arrays.

It is another object of this invention to provide an improved electronic storage array in which the storage cells are formed on an integrated circuit chip together with support circuits by known integrated circuit processes.

Lastly, it is an object of this invention to form a bistable circuit element on an integrated circuit chip, the state of the element being alterable by the application of electrical signals on two or more control lines, the state of the bistable circuit element being held at one of two selected levels of conductivity by the current flow through the bistable circuit element.

2. Background Art

Electronic storage arrays having storage cells formed on integrated circuit chips are well known in the art. There are trade-offs which determine the selection of a particular design for a desired application. For example, advantageous features such as high speed and DC stability usually require greater power consumption and a greater area per cell on the integrated circuit chip. Other factors such as particular semiconductor processes for the formation of the cells in integrated circuit form, noise margins, packaging techniques, etc. all enter into the selection of a particular design. The prior art is exemplified by the following two U.S. patents: (1) Dennard U.S. Pat. No. 3,387,286 entitled "Field-Effect Transistor Memory" issued on June 4, 1968. (2) Sonoda U.S. Pat. No. 3,949,385 entitled: "DC Stable Semiconductor Memory Cell", issued Apr. 6, 1976.

The Dennard patent describes a one device memory cell including a capacitor and a field effect transistor switch. Such cells are typically AC stable (require periodic refreshing). Frequently, such cells are also characterized by destructive read-out requiring information to be rewritten into a cell after the sensing step.

The Sonoda patent describes a four device memory cell having four field effect transistors. The Sonoda cell is DC stable and is further characterized by non-destructive read-out.

BRIEF DESCRIPTION OF THE DRAWINGS

In the accompanying drawings forming a material part of this disclosure:

FIG. 5 is a waveform diagram depicting the operation of the embodiment of FIGS. 1-4.

FIG. 10 is a waveform diagram depicting the operation of the embodiment of FIGS. 6-9.

DISCLOSURE OF INVENTION

For further comprehension of the invention, and of the objects and advantages thereof, reference will be had to the following description and accompanying drawings and to the appended claims in which the various novel features of the invention are more particularly set forth.

The present invention provides a storage cell having the advantageous features of DC stability, non-destructive read-out, and high density in integrated circuit form. DC stability is provided by a conductivity modulated bistable storage element. A lightly doped P type semiconductor region forms the key bistable element of the storage cell and normally has a high resistance as a first stable state. The high resistance of the P type region is substantially reduced by the injection of electrons from a proximate N type semiconductor region. At this lower resistance, the cell will conduct a greater amount of current. The higher current flow maintains the low resistance state of the P type region, thereby providing the second DC stable state. Reading is performed by sensing the current flow without disturbing the information contained in the storage cell. High density is obtained by containing the entire storage cell within a single isolated zone in the integrated circuit chip.

Figure 1:
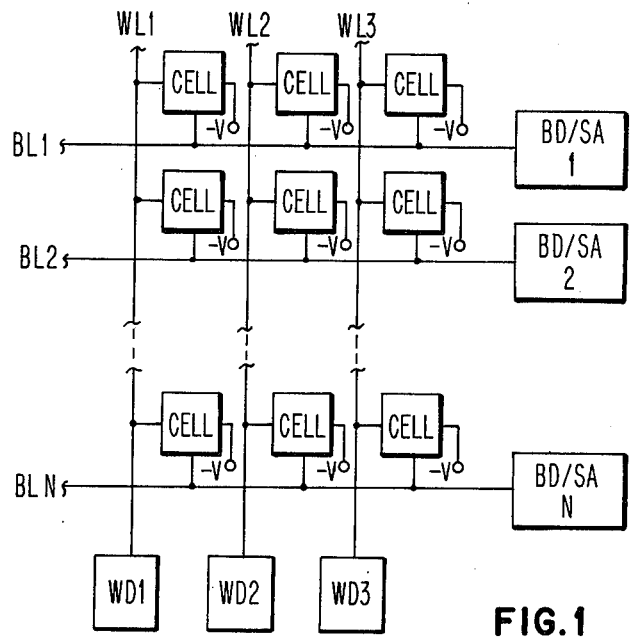
FIG. 1 is a block diagram of an array of memory cells.

Refer now to FIG. 1 which illustrates an array of cells in accordance with the present invention. For purposes of illustration, only nine cells are shown in the drawing. In practice, thousands of such cells are contained on a single integrated chip. This arrangement of cells, per se, does not differ from the prior art. Each cell is connected to a word line WL and a bit line BL. Each word line is connected to a word driver WD; while each bit line is connected to a bit driver/sense amplifier BD/SA. Each cell also requires a fixed bias potential as is illustrated by the −V terminal. This −V terminal does not have to be a separate connection to each cell. Rather, a substrate biasing potential can apply the required fixed potential to all the cells on the integrated circuit chip.

Figure 2:
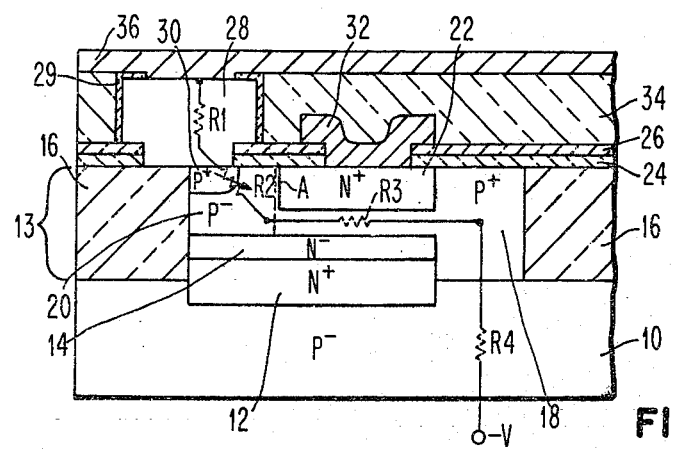
FIG. 2 is a vertical cross section of a memory cell in integrated circuit form.

Refer now to FIG. 2 which illustrates one type of storage cell, in accordance with my invention, suitable for use as a storage cell in the array arrangement of FIG. 1. Once the storage cell structure of FIG. 2 is shown, those skilled in the art will use various known semiconductor processing techniques for fabricating it. For purposes of illustration, the major steps of one such process will now be described.

A P type silicon monocrystalline substrate 10 doped with boron impurities at about $10^{14}$ atoms per cc is used as the substrate. Known lithographic processing techniques are then used for selectively introducing N type impurities (usually arsenic) to form N+ type subcollector region 12. A layer of N type monocrystalline silicon is then epitaxially deposited on substrate 10. Auto doping causes the N+ subcollector to outdiffuse into the epitaxial layer 13. The portion of the N type epitaxial layer 13 remaining in FIG. 2 after subsequent processing steps is N type region 14. The doping level of the N epitaxial region is approximately $2 \times 10^{16}$ atoms per cc; while the doping of the N+ subcollector is about $10^{20}$ atoms per cc.

After the epitaxial layer is deposited, recessed oxide isolation (ROI) 16 is provided. Recessed oxide 16 can extend into substrate 10 and must at least reach substrate 10 in order to provide isolated zones for each cell. One technique for forming recessed oxide 16 is by selectively etching into the epitaxial layer and then exposing the suitable masked surface to an oxygen containing atmosphere at high temperatures thereby driving oxygen atoms into the silicon material and converting it in-situ to silicon dioxide 16.

To this point the process is not unlike similar processes for the formation of single isolated bipolar transistors. To produce such a transistor, one would merely proceed with the formation of a P type base region, an N type emitter region into the base region and suitable contacts to the emitter, base, and collector regions. The memory cell of the present invention, however, requires a "quasi-base" region with two different doping levels. A relatively high doping level is required in the P+ region 18 while a relatively low doping doping level is required in P− region 20. It should here be noted that P− region 20 provides the variable resistance R2 which has two stable states of resistance and provides the heart of the storage element.

The quasi-base region of the storage cell which includes both P+ P region 18 and P− region 20 can be formed in a number of different ways. For example, the entire P region could receive a P− doping level with region 18 receiving a subsequent heavier doping of P type impurities. Alternatively, regions 18 and 20 can be formed by completely separate photolithographic steps. Also, as will become apparent, the location of the interface between regions 18 and 20 is not critical. All that is required is that region 18 be highly doped as a conventional base region with impurities in the order of $10^{17}$ atoms per cc or more; while region 20 is lightly doped with impurities in the order of $10^{15}$ to $10^{16}$ atoms per cc. The usual P type dopant is boron. The nominal difference between the doping levels of the lightly and highly doped P type regions is most significant—and should be at least one order of magnitude.

Emitter region 22 is then formed into the quasi-base region. If the N+ emitter 22 is formed entirely into region 18, as shown, then the vertical geometry between region 22 and 14 can be maintained as in conventional bipolar transistors. If N+ emitter 22 were formed primarily into region 20 resulting in the region 20 to region 18 interface being moved to the right side of emitter region 22, then appropriate adjustments in the processing would be required to obtain the desired suitable dimension between regions 14 and 22. This process modification is avoided by forming region 22 entirely into region 18, impurity concentration of the emitter conventionally being in the order of $10^{20}$ atoms per cc or more. The usual emitter dopant is arsenic, although it is known to use other dopants such as phosphorus.

The surface of the semiconductor is selectively covered by a dielectric such as silicon dioxide layer 24 and silicon nitride layer 26. It is preferable to form silicon dioxide layer 24 by thermal oxidation, in which case there would be no separate layer 24 over recessed oxide 16. However, it is known to form thermal oxide 24 over the semiconductor regions, followed by a layer of chemical vapor deposited (CVD) oxide over the entire surface including recessed oxide 16.

The storage cell of this invention functions best with an additional resistor (for limiting current flow) formed by polysilicon region 28. First, the illustrated opening in oxide layer 24 and nitride layer 26 provides a polysilicon contact hole. Polycrystalline silicon is blanket deposited and selectively etched to form resistor R1. The polysilicon 28 is doped with P type impurities (boron in the order of at least $10^{15}$ atoms per cc) which tend to outdiffuse into region 20 forming a more highly doped P type contact area 30. Alternatively, P+ impurities are introduced in a separate step to form region 3 (e.g. ion implantation of boron).

Polysilicon 28 is then oxidized, and contact holes are opened in insulator 24 and 26 to provide metallic contacts 32 to emitter region 22. These contacts 32 become the metal bit lines of the array. The entire structure is then coated with polyimide 34 resulting in a planar structure. Silicon dioxide can be used in place of the polyimide but this would result in a non-planar structure. Polyimide layer 34 is blanket etched by reactive ion etching (RIE) with an end point detection at the top surface of silicon dioxide layer 29. An opening in the top surface of oxide layer 29 is then provided with the subsequent formation of second level metal aluminum word lines 36 making contact with polysilicon 28.

Figure 3:
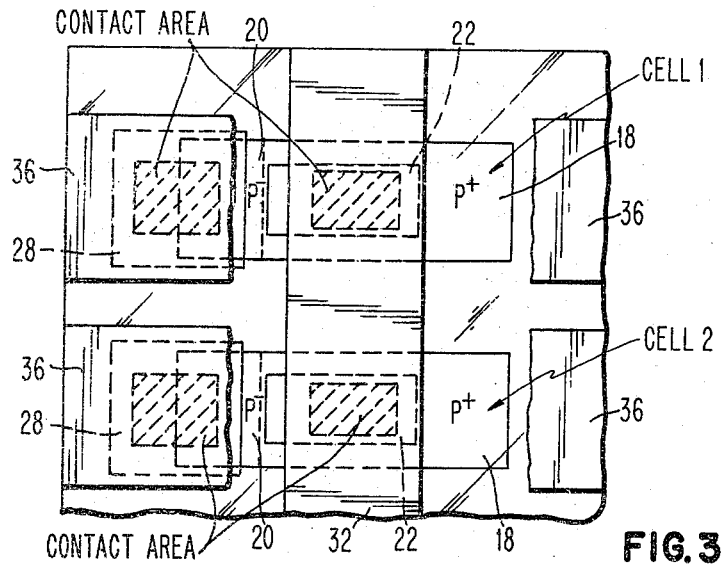
FIG. 3 is a top view of two adjacent memory cells in integrated circuit form.

The FIG. 2 vertical structure will be better understood by reference to FIG. 3 which is a top view. Two adjacent cells along bit line 32 are shown. Corresponding regions have been identified by corresponding reference numerals. The respective areas identified as "contact area" correspond to the interface regions such as the contact between line 32 and N+ region 22 and polysilicon 28 with ROI 16 and P region 20.

Figure 4:
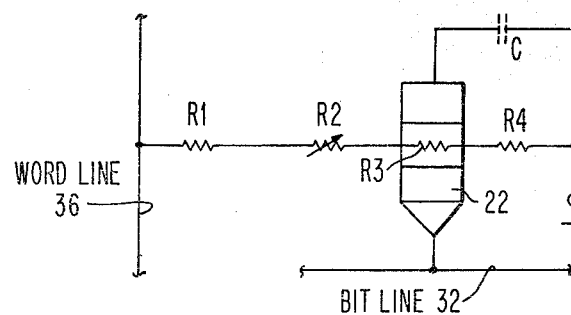
FIG. 4 is an equivalent circuit diagram of the memory cell depicted in FIGS. 2 and 3.

The utilization of the structure of FIGS. 2 and 3 as a bistable circuit element and more particularly a storage element in an integrated circuit array, is best understood by reference to the equivalent circuit of FIG. 4. The equivalent circuit is essentially a plurality of series connected resistances (R1, R2, R3, and R4), R2 being a variable resistor which is maintainable in its low resistance state by conductivity modulation. Bit line 32 is connected to N+ emitter region 22. Word line 36 is connected to resistor R1 which is formed by polysilicon 28. Resistor R1 is connected to variable resistor R2 which is formed in P region 20. Resistor R2 is connected to resistor R3 which is formed in P+ region 18. Resistor R4 is connected to resistor R3, R4 being formed in the P− substrate 10. The −V terminal is connected to the substrate. Also shown in the equivalent circuit is a parasitic compacitance C between the n+ collector region and the substrate. This equivalent circuit is shown to facilitate the understanding of the operation of the storage cell.

Referring to FIGS. 2 and 4, the operation of the cell will be briefly described. Assume first that resistor R2 is in its high resistance state. At steady state, word line 36 is held at approximately +1 volt while bit line 32 is held at approximately 0 volts. The substrate potential is the most negative applied potential usually in the order of −2 to −3 volts. When resistor R2 is in its high impedance state, the potential at the leading edge A of N+ emitter region 22 is insufficient to forward bias the PN junction formed by regions 20 and 22. Conventionally, 700 millivolts is required to forward bias such a PN junction into conduction. In fact, when bit line 32 is brought to −0.5 volts, the PN junction will still not exceed 700 millivolts so that cell current will remain near 0 milliamps (other than spurious noise).

When it is desired to change the binary state of the cell, resistor R2 must have its resistance changed to its low impedance state. This is accomplished by injecting electrons from N+ region 22 into P region 20 as will now be described. Selected word line 36 is brought to +1.5 volts while selected bit line 32 is brought to −0.5 volts. This 2 volt difference is sufficient to forward bias the leading edge A of emitter 22, forward biasing the PN junction. With this PN junction forward biased, a higher level of current is conducted in the series electrical path starting with word line 36, through polysilicon resistor R1, through variable resistor R2, across the PN junction to emitter 22 and terminating with bit line 32. At this point, assume that the cell is returned to its standby state. That is, the word line is returned to +1 volt while the bit line is returned to 0 volts. This potential difference of 1 volt is sufficient to maintain current conduction from word line 36 to bit line 32. Region 20 continues to be injected with electrons maintaining it in its low impedance state so that the potential across the PN junction continues to be held at higher than the required 700 millivolts. With resistor R2 in its low impedance state, there is also a higher current conduction from word line 36 through resistor R1, through resistor R2, through resistor R3, and through resistor R4 to terminal −V. However, the cell power dissipation is held low because of the relatively high resistance value of the "pinched base" resistor R3.

Resistor R2 will continue in its low impedance state until a binary "0" is written. This is accomplished by clearing of the memory which involves bringing the word lines to 0 volts. This in effect sets a binary "0" in all of the cells along the selected word lines. This binary "0" is maintained if only the word line or the bit line, but not both, have their voltage altered as stated above, during the write operation, (i.e. writing a binary "0" is essentially accomplished by not writing a binary "1").

Thus, the key feature of this cell is resistor R2 in the lightly doped quasi-base region. To change the binary state of a selected cell, electrons are injected into the lightly doped quasi-base region to increase its conductivity by about 1 order of magnitude. Electrons are injected from the N+ emitter region 22. N type regions 14 and 12 assure that the injected electrons are reflected back into the lightly doped region 20. In this manner, resistor R2 assumes one of two stable states to perform binary storage. Resistors R1 and R3 perform current limiting functions when R2 is in its low impedance state.

Resistor R4 is merely an extension of resistor R3. For example, contact could be made to the P region 18 from the top surface so that R4 would be eliminated and the entire resistance R3 would be in the P+ region between R2 and −V. This would result in a slightly larger cell configuration. However, it would also permit replacing the P− substrate 10 with a dielectric substrate such as sapphire. With a dielectric substrate, subcollector 12 and N type epitaxial layer would not be needed. A lightly doped P type epitaxial layer extending down to the dielectric substrate would form region 20 with a subsequent doping step raising the P type doping concentration of region 18. This and other advantageous (and disadvantageous) features of dielectric substrates are adaptable to the present invention. For example, the dielectric substrate may absorb a certain number of electrons during initial operation after which time electrons would be reflected as in the case of an N+ epi layer.

R3 is the only essential fixed resistor and has the important function of providing a voltage divider effect. This permits the P region 20 to be maintained at a sufficiently high potential to ensure the injection of electrons when resistor R2 is to be maintained in its low impedance state. In the absence of resistor R3 (and/or R4), P region 20 would be brought too close to −V to permit the PN junction at leading edge A to become forward biased. As seen by reference to FIGS. 1–4, this cell is extremely dense and requires only two contacts. Thus, as most clearly seen in FIG. 3, the cell essentially occupies the amount of room required for the usual pitch of a word line and a bit line.

It is apparent from the foregoing, that essential elements of the herein described storage cell include variable resistor R2 connected in series with fixed resistor R3 and region 22 for injecting carriers into the R2 region to alter its resistivity, the low resistivity being maintained by conductivity modulation. In integrated form, this is accomplished by forming a first semiconductor region (essentially a quasi-base region) consisting of a lightly doped P type region 20 and an adjacent highly doped P type region 18. There is also required at least one second semiconductor region (emitter region 32) formed into the first semiconductor region to form a PN junction A therewith. A first, relatively positive, potential is applied to P− region 20 by means of conductor 36 and polysilicon region 28. A second potential source for applying a relatively negative potential to the highly doped P type region 18 is applied by means of terminal −V. A third potential source having first and second levels applies a variable potential to N+ region 22 by means of bit line 32. This third potential level in its first level is insufficiently negative with respect to the word line potential to forward bias the PN junction thus inhibiting current flow through the cell. The third potential source at its second level is sufficiently negative with respect to the first potential (via word line 36) to forward bias PN junction A, thereby injecting electrons into the lightly doped P type region 20 and lowering its resistivity. This establishes current flow in the cell which is maintained in a series electrical path from the first potential through at least a portion of the quasi-base region and emitter 22 to the bit line even after the bit line is returned to its first level. Writing into and reading from an array of such bistable elements is accomplished in accordance with the waveform diagram of FIG. 5.

Referring now to FIG. 5, the step of writing into a row of cells requires bringing the word line down from its standby level of 1 volt to 0 volts, or at least less than 0.5 volts. In this example, the standby level of the bit line is also at 0 volts. With both the bit line and the word line at the same potential, there is clearly insufficient potential for forward biasing the leading edge A of the PN junctions between N region 22 and P region 20. Thus, all of the cells along the row of the select word line are reset to store a binary "0". To read the "0" requires merely bringing the word line to +1.5 volts and sensing the current in the bit line.

To write a binary "1", the word line is brought to +1.5 volts, as in the reading step. Additionally, the bit line is brought to −0.5 volts. In this way, the cell at the intersection of the selected word line and bit line will receive a potential difference of 2.0 volts. This is enough to raise the leading edge A of the PN junction above the 700 millivolts required for forward conduction. Electrons are injected from the emitter region 22 into the P region 20, flooding this region with electrons so that resistor R2 is placed in its low impedance state. At this point, the word line and bit line return to their quiescent standby levels of 1 volt and 0 volts respectively. This 1 volt differential is sufficient to maintain the leading edge A forward biased so that conduction continues with electrons continuing to be injected into the P type region 20. To read this cell, the word line is again brought to +1.5 volts. Since the cell is conducting, there will be an increase in current flow in the bit lines which will be sensed as a binary "1".

The bit line sense current can be sensed both as the DC level shift or as a ΔI transient current change. For example of a sense amplifier suitable for sensing a DC current change see Malaviya U.S. Pat. No. 4,196,363. As an example of sensing a transient current, see Sonoda U.S. Pat. No. 3,969,708. Transient sensing essentially involves coupling a bit line to a sense amplifier through a capacitor. When sensing steady state current I in the bit line, a binary "1" is detected by sensing a steady level in excess of a threshold current T.H., which depends on the number of bits along the bit line storing a "1".

For purposes of explaining the waveform diagram of FIG. 5, assume that a binary "0" is written in the entire array. This brings the bit line sense current I to essentially 0 amps. The occurrence of a read signal causes virtually no change (other than noise coupling) in the bit line sense current. This is true for both the steady state current I and the transient current ΔI. Note that the transient current is of significance only during read time and has therefore been designated only by dashed lines at all other times.

Assume now that a binary "1" is written into selected cells. At this point, the word line is brought from +1.0 volt to +1.5 volts resulting in a large current in the bit line. Subsequently, the word line returned to 1 volt resulting in a quiescent level of standby current in the bit line. The highest value this current can assume occurs when all the cells along the bit line are storing a binary "1". The lowest level of current in the bit line during standby will occur when all the cells along the bit line are storing binary "0" values. In most applications, of course, there will be some binary "1" and some binary "0" values stored along the bit line. For sensing the steady state DC current, the threshold of the sense amplifier is set slightly above the current level in the quiescent state with all the cells storing a binary "1". When the word line corresponding to a cell storing a binary "1" is brought to +1.5 volts, the increased current is above the threshold level T.H. of the sense amplifier and results in the reading of the binary "1". The increase in current is sufficiently large so that even if all other cells along the bit lines stored binary "0", the increase in current through this one cell is sufficient to exceed the threshold level of the sense amplifier. Sensing can also be performed by coupling the bit line to an AC sense amplifier through a capacitor. In the standby condition, the current value does not change and so the ΔI is at a zero level. When a binary "1" is sensed, there is a sudden increase in ΔI which is sensed by the AC sense amplifier and indicates that a binary "1" was stored. It will be noted that the cell will be easier to write if the −V bias terminal is used as a second word line whose potential is raised by about +0.5 volts during the write operation only.

Figure 6:
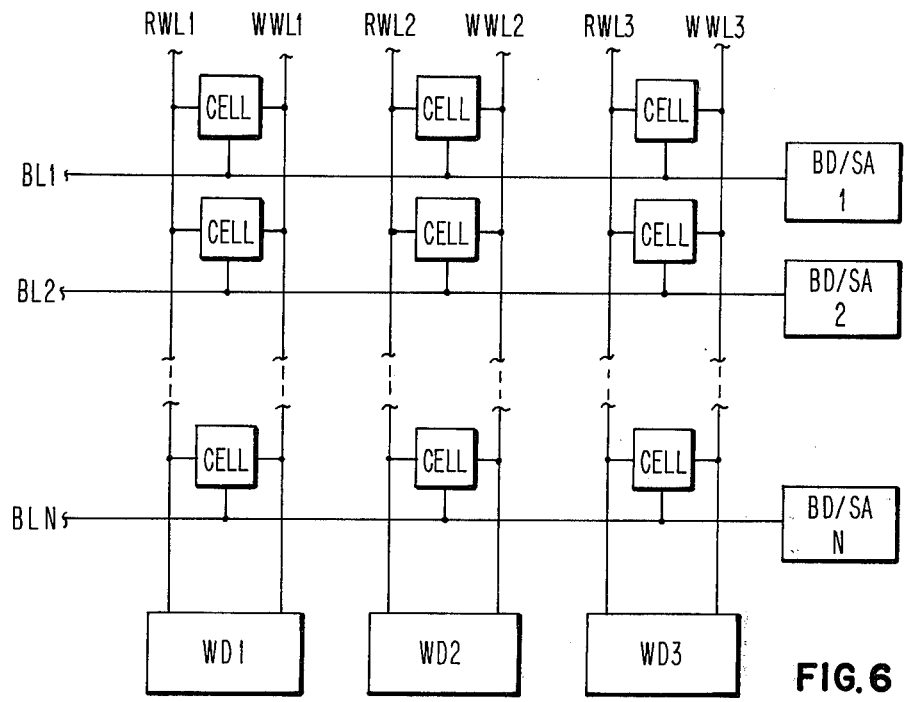
FIG. 6 is a schematic representation of an alternate embodiment array of cells.

In some applications, the extreme density provided by the embodiment of FIGS. 1-5 may not be required. Other features such as speed, higher noise margins, etc. may be desired. Such an alternate arrangement is provided by the embodiment of FIGS. 6-9. FIG. 6 shows an arrangement of nine cells with associated bit drivers/sense amplifiers and word drivers. Again, although only nine cells are shown, it is understood that thousands of such cells are intended to be placed on a single integrated circuit chip.

Figure 7:
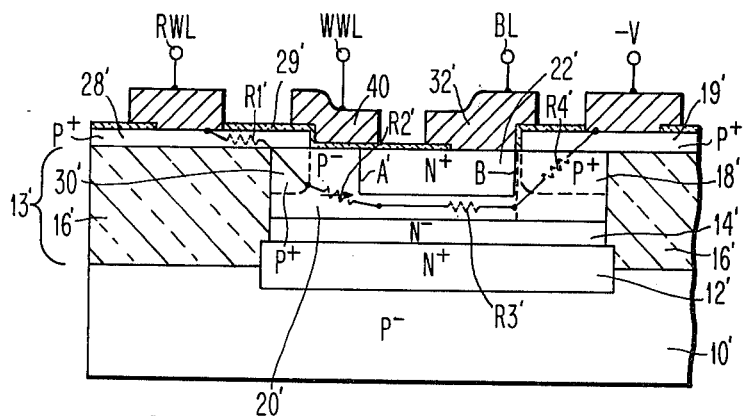
FIG. 7 is a vertical cross section of a memory cell in integrated circuit form in accordance with the alternate embodiment.

Refer now to FIG. 7 which shows a vertical cross section of this second embodiment of the invention. The similarities to prior FIG. 2 are such that corresponding reference numerals with prime notation are utilized insofar as practical. Note at the outset that there is no substrate contact so that this embodiment is readily adapted to a dielectric substrate 10' as well as the illustrated P− substrate 10'. As previously pointed out, the use of a dielectric substrate eliminates the need for N+ subcollector region 12' and N type epi region 14'. In this FIG. 7 embodiment, the P+ type region 18' is shown interfacing with P type region 20' near the lagging edge B rather than the leading edge A' of the PN junction with N type emitter 22'. This provides a number of advantages and disadvantages which are also applicable to the FIG. 2 embodiment. The advantage is that resistor R2 will have a higher impedance in its high impedance state, while its low impedance state will remain substantially unaffected. Thus, there is a greater distinction between the binary "0" and the binary "1" levels. One disadvantage of this arrangement is that the forming of N type emitter 22 into a P− region requires specifically tailored process steps. The adjustment of temperature, doping time, doping concentration, etc. are well within the reach of those skilled in the art but would still have to be adjusted as being different from the fabrication of conventional transistors in which the N region is implanted or diffused into a P+ type base region. Another difference in this arrangement is that resistor R4' is formed in both P+ region 18' as well as polysilicon region 19'. Resistor R4' will, of course, have a higher value than that of resistor R4 in FIG. 2. Polysilicon resistor R1' corresponds to resistor R1 in FIG. 2 but has been placed horizontally instead of vertically.

The principal distinction in the FIG. 7 embodiment is the use of a write word line (WWL) in addition to the previously utilized read word line (RWL). Also, the P+ type contact diffusion 30' extends further into the P region 20'. The write word line WWL is connected to and functions as a gating electrode 40. As will be described later herein, electrode 40 is activated only during a write cycle. As will be noted, an up level on the write word line WWL will attract electrons under electrode 40 tending to enhance the injection of electrons into P− region 20. In the event that the bit line BL is simultaneously brought to a down level, resistor R2' will in fact be placed into its low impedance state.

Figure 8:
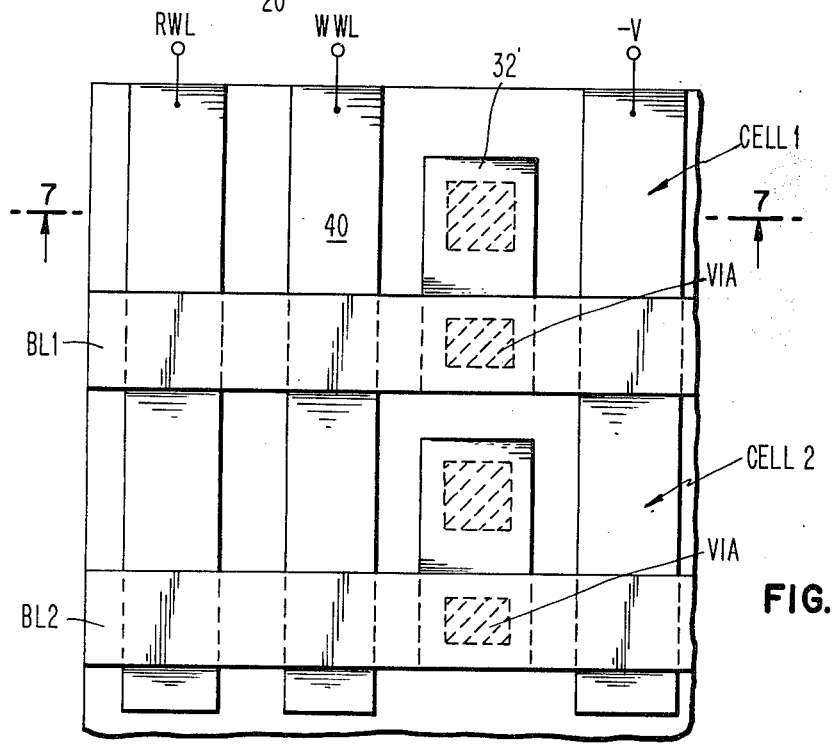
FIG. 8 is a top view of two adjacent memory cells in integrated circuit form in accordance with the alternate embodiment.

Refer now to FIG. 8 which is a top view of the cross section of FIG. 7. Corresponding elements have been designated with corresponding reference numerals. FIG. 8 shows how cell 1 is accessed by means of bit line 1, the two word lines and the −V bus. Cell 2 is accessed by bit line 2, the two word lines and the −V bus. Although this arrangement is not as dense as the embodiment with the top view at FIG. 3, it has the advantages of better noise margin and reduced voltage operation of the cell.

Figure 9:
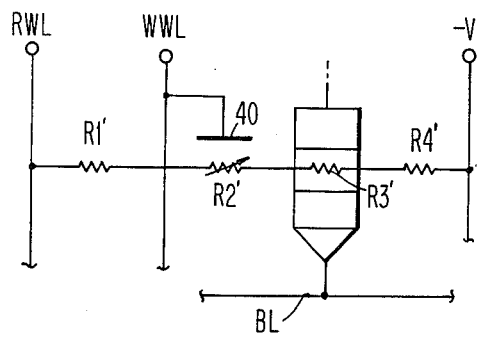
FIG. 9 is an equivalent circuit diagram of the memory cell depicted in FIGS. 6, 7 and 8.

Refer now to FIG. 9 which is an equivalent circuit of the cell illustrated in FIGS. 7 and 8. Note the series electrical path from the read word line (RWL) through fixed polysilicon resistor R1', variable P type resistor R2' and fixed P type resistor R3' to fixed polysilicon resistor R4' to potential terminal −V. The state of the cell is determined by whether R2' is in its high or low impedance state. R2' is normally in its high impedance state, this being the intrinsic resistance of P region 20'. With the combination of a signal on the write word line WWL and the bit line BL, electrons are injected from N type region 22' into P type region 20' putting resistor R2' in its low impedance state. This low impedance state is maintained after the gating signal is removed from the write word line WWL. In short, when the bit line is brought to a down level while the write word line (WWL) is brought at an up level, a binary "1" will be written; while if the bit line is brought to an up level while the write word line is brought to an up level, electrons are not injected into region 20' and a binary "0" is written.

Thus, in both the foregoing embodiments, a bistable storage cell is provided. In each case, storage is in a series electrical path comprising a plurality of resistance elements, at least one of the resistance elements (R2 or R2') being variable into a high or low impedance means. The variable resistor is a lightly doped P type region (20 or 20') into which electrons are injected from an adjacent highly doped N type region (22 or 22'). Control means supply a potential difference across the leading edge A (A') of the PN junction to render it conductive or non-conductive depending on the binary level desired to be stored. In case a binary "1" is stored and the lightly doped P region is flooded with electrons, the conductive condition is maintained even after the word line and bit line terminals are returned to standby potentials.

The operation of the storage cell of FIGS. 7 and 8 will be better understood by reference to the waveform diagrams of FIG. 10. Note that the write word line WWL is activated only when it is desired to write into the cell; while the read word line RWL is only activated when it is desired to read from the cell. When it is desired to either read from the cell or write a binary "1", then the bit line BL is brought to a down level. When it is desired to write a binary "0", the bit line is brought to an up level. Thus, in the illustrated time sequence, the first deviation from the standby condition shows the bit line BL brought from 0 to +0.5 volts while the word line WWL is brought from 0 volt to an up level of +2.0 volts to write a binary "0". This information is read by bringing the read word line up to +2.0 volts while bringing the bit line down to −0.5 volts. The bit line sense current will not increase when the cell is non-conducting (except for the slight noise deviation shown). Next, a binary "1" is written by bringing the write word line WWL to +2.0 volts while the bit line BL is brought to −0.5 volts. This places the cell in the conductive state. Thus, when the read word line RWL is brought to +2.0 volts and the bit line BL brought to −0.5 volts to read, current will flow in the bit line indicating sense current as shown. As in the prior art embodiment, either a DC or AC sense amplifier can be used to measure either the change in current above the threshold level or the current transient, whichever is desired for a particular application. However, a double emitter storage cell can be used in all such cases to simplify the sensing operation by eliminating the need for sensing ΔI.

Figure 11:
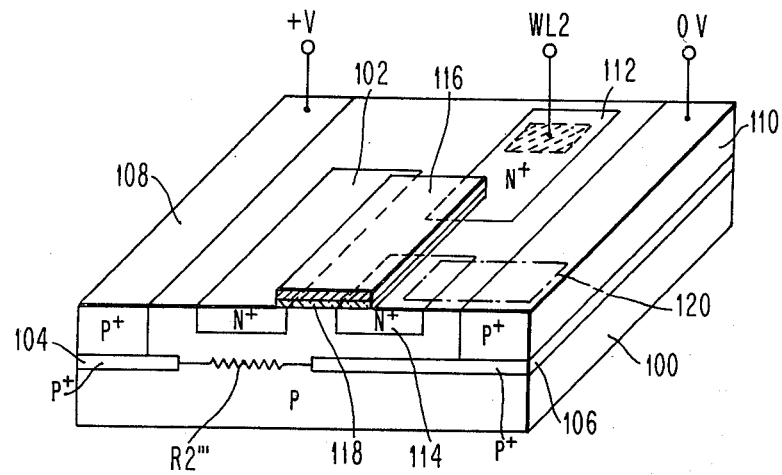
FIG. 11 is a plan view of a still further alternate embodiment.

Refer now to FIG. 11 which shows a still further embodiment of the invention. While FIG. 2 illustrates a bipolar embodiment and FIG. 7 illustrates a combination of bipolar and field effect technologies, FIG. 11 illustrates a purely field effect embodiment. The device of FIG. 11 is similar to the prior embodiment in that storage of binary information is accomplished primarily by means of variable resistor R2'''. This resistor is in a lightly doped P substrate 100 and has its impedance altered to the low impedance state by the injection of electrons from proximate N type drain region 102. In order to limit variable resistor R2''' to the vicinity of N type region 102, highly conductive P+ regions 104 and 106 are formed by ion implanting P type impurities. P type impurities are also implanted and/or diffused into substrate 100 to form P+ regions 108 and 110. Next, N type impurities are introduced into substrate 100 to form the aforementioned drain region 102, as well as dual source regions 112 and 114. After the formation of a suitable gate oxide 118, gate 116 is formed. Gate 116 can be metal or polysilicon material as desired. Also, it is well known to form gate 116 first as a polysilicon gate with the N type regions 102, 112, and 114 being formed subsequently and therefore self-aligned. Also, FIG. 11 shows only one cell although thousands of such cells are intended to be placed into a single substrate. The illustrated cell is suitably isolated from other cells by conventional field oxide isolation.

Figure 12:
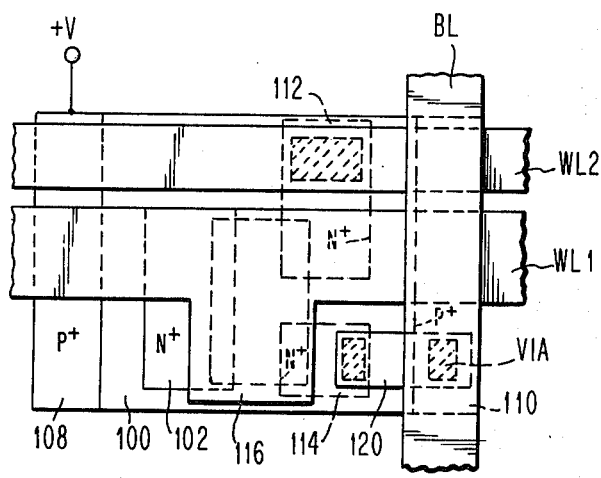
FIG. 12 is a top view of the FIG. 11 embodiment.

Refer now to FIG. 12 which is a top view of the FIG. 11 structure. Corresponding elements have been marked with corresponding reference numerals.

Source region 112 has a contact to first level metal word line WL2. Source region 114 connects, by means of the illustrated via and conductive strap 120 to a second level metal bit line BL (not shown in FIG. 11). Gate 116 is part of first level metal word line WL1. Drain region 102 does not have a direct electrical connection.

The cell of FIG. 11 could be characterized as an FET having a drain and two source regions. The bistable element of the storage cell is resistor R2''' which has a high resistance in lightly doped substrate 100 until electrons injected from proximate N+ region 102 substantially reduce its resistivity; the reduced resistivity being maintained by the conduction of the cell. In operation, a DC bias of about +1 volt is applied to terminal +V (region 108) while 0 volts is applied to region 110. Also, a DC voltage of +3 volts is applied to terminal WL1, which is connected to the gate electrode 116. (Alternatively, a depletion mode FET would achieve the same result with 0 volts applied to terminal WL1. This would eliminate the need for a separate +3 volt supply as the same 0 volts applied to region 110 could be applied to the gate region 116.)

To write a binary "0", word line WL2 is brought to 1 volt while the bit line BL (region 114) is also brought to 1 volt. To write a binary "1", word line WL2 is brought to +1 volt while the bit line is brought to 0 volts.

Note that bit line BL is connected to N+ region 114. Thus, in the case when region 114 is brought to 0 volts, the channel region under the gate conducts bringing N+ region 102 negative causing it to inject electrons into the P type substrate 100, thereby lowering the resistivity of resistor R2'". This, of course, lowers the resistivity of the substrate particularly in the area between +V (region 108) and region 102. Once a binary "1" has been written, word line WL2 is brought down to approximately +0 volt. This is sufficient to maintain the conductive standby condition of the cell even if the bit line (region 114) is made positive.

To read the cell, all unselected word lines WL2 are left at 0 volt while the selected word line is brought to +0.3 volts. During the read cycle, the bit lines are brought to +0.2 volts. A sense amplifier connected to the bit line will sense no current for a binary "0" but significant DC current for a binary "1".

The FIG. 11/FIG. 12 embodiment can be modified in a number of ways. For example, although two levels of metal are shown, this cell can also be made with single level metal. Also, no isolations are required as adjacent cells can use the P+ lines 108 and 110 respectively as common voltage lines. Also, the conductivity modulation effect may be enhanced by lowering the substrate doping and/or by pinching the R2'" resistor region by using a P type epitaxial layer over an N type substrate. Of course, all diffusion types may be inverted to make it an N type epitaxial layer over a P type substrate. Voltage polarities should be inverted accordingly. Since the edge of region 102 closest to the +V voltage will be carrying maximum current while the remote edge of region 102 under the gate will have the least current, all the minority carrier injection will be in that portion of the substrate which tends to make the junction conduct. For this reason, the latching action is reinforced when conduction occurs.

All the operating voltage levels, as well as the impurity doping levels quoted herein are for illustration purposes only. Actual working voltages will obviously depend upon several conflicting design requirements such as power dissipation, signal delay, compatibility with other chips (e.g. logic chips) used in a particular machine etc. Also, the process is generally optimized to be compatible with other related processes in a factory, consistent with the design objectives of a given memory array.

While the invention has been illustrated and described with respect to preferred embodiments, it is to be understood that it is not limited to the precise constructions herein disclosed and the right is reserved to all changes and modifications coming within the scope of the invention as defined in the appended claims.

Having thus described my invention, what I claim as new, and desire to secure by Letters Patent is:

1. An integrated circuit semiconductor storage array formed on a monolithic substrate, having a plurality of conductivity modulated storage cells each contained within a single isolation zone of said substrate, at least one of a plurality of word lines and at least one of a plurality of bit lines electrically contacting each one of said plurality of conductivity modulated storage cells, comprising:
   a first semiconductor region formed into said isolation zone and consisting of a lightly doped P type region forming a variable resistance and a highly doped P type region forming a fixed resistance, the difference in doping level between the lightly and highly doped regions being at least one order of magnitude;
   a second semiconductor region formed into said first semiconductor region to form a PN junction therewith and consisting of a highly doped N type region;
   an electrical path extending from said at least one of a plurality of word lines through at least a portion of said first and second semiconductor regions to said at least one of a plurality of bit lines;
   a first potential source for applying a relatively positive potential to the said at least one word line;
   a second potential source for applying a relatively negative potential to the highly doped portion of said first region; and
   a third potential source for applying a variable potential, having first and second levels, to said at least one bit line, said third potential in its first level being insufficiently negative with respect to the level of said first potential source to establish a potential difference for forward biasing said PN junction thereby inhibiting current flow in said electrical path, said third potential in its second level being selectively more negative with respect to said first potential source sufficient to establish a potential difference for forward biasing said PN junction, thereby injecting electrons into said lightly doped portion of said first semiconductor region and lowering its resistivity;
   whereby current flow is maintained through said electrical path after said third potential source is brought to its first level.

2. An integrated circuit semiconductor storage array as in claim 1 wherein said electrical path further comprises:
   a polycrystalline resistor; and
   an additional highly doped P type region, both connected between said word line and the lightly doped portion of said first semiconductor region.

3. An integrated circuit semiconductor storage array as in claim 1 further comprising:
   a fourth potential source connected to said substrate and resistivity coupled through said substrate to the highly doped portion of said first semiconductor region.

4. An integrated circuit semiconductor storage array as in claim 1 further comprising:
   a second word line formed over the lightly doped portion of said first semiconductor region and separated therefrom by a thin dielectric, thereby forming a gating electrode.

5. An integrated circuit semiconductor storage array as in claim 4 wherein said electrical path further comprises:
   a polycrystalline resistor; and
   an additional highly doped P type region, both connected between said word line and the lightly doped portion of said first semiconductor region.

6. An integrated circuit semiconductor storage array as in claim 4 further comprising:
   a fourth potential source connected to the highly doped portion of said first semiconductor region by means of a polycrystalline resistor.

7. An integrated circuit semiconductor storage array formed on a monolithic substrate, having a plurality of conductivity modulated storage cells each contained within a single isolation zone of said substrate, at least one of a plurality of word lines and at least one of a plurality of bit lines electrically contacting each one of said plurality of conductivity modulated storage cells, comprising:

a pair of spaced apart highly doped P type regions formed in a lightly doped P type substrate with portions of said spaced apart regions extending within said substrate proximate to each other to form a variable resistance in said substrate between the proximate portions of said pair of spaced apart regions;

a first highly doped N type region formed in said substrate proximate to said variable resistance;

a second highly doped N type region formed in said substrate proximate to said first highly doped N type region in a drain/source relationship therewith;

a third highly doped N type region formed in said substrate proximate to said first highly doped N type region also in a drain/source relationship therewith;

a gate electrode formed over a portion of said first, second, and third highly doped N type regions and portions of the substrate therebetween;

means for applying a relatively positive potential to the first one of said pair of spaced apart P type regions and a relatively negative potential to the second one of said pair of spaced apart P type regions;

said gate electrode being connected to a first word line, said third highly doped N type region being connected to a second word line, said second highly doped N type region being connected to a bit line;

means for adjusting the relative potentials applied to said first word line and said bit line to bring said first highly doped N type region sufficiently negative to inject electrons into the adjacent substrate thereby bringing said variable resistor to its low impedance state; and means for bringing said second word line to a potential sufficiently negative with respect to said gate electrode to maintain the low impedance state of said variable resistance after said bit line has been raised to a potential sufficiently high with respect to said gate electrode to inhibit conduction of current through said variable resistance.

8. An integrated circuit semiconductor storage array as in claim 7 wherein said spaced apart P type regions comprise:
buried fingers formed by ion implantation extending towards each other within the substrate.

9. An integrated circuit semiconductor storage array as in claim 7 wherein the bit line connection to said second highly doped N type region is by means of a second level metal layer.

10. An integrated circuit semiconductor storage array formed on a monolithic substrate, having a plurality of conductivity modulated storage cells each contained within a single isolation zone of said substrate, at least one of a plurality of word lines and at least one of a plurality of bit lines electrically contacting each one of said plurality of conductivity modulated storage cells, comprising:

a first semiconductor region consisting of a lightly doped P type region doped with P type impurities to a concentration not greater than $10^{16}$ atoms/cc and an adjacent highly doped P type region doped with P type impurities to a concentration not less than $10^{17}$ atoms/cc;

at least one second semiconductor region formed into said first semiconductor region to form a PN junction therewith and consisting of a highly doped N type region doped with N type impurities to a concentration not less than $10^{19}$ atoms/cc;

a first potential source for applying a relatively positive potential to the lightly doped P type region;

a second potential source for applying a relatively negative potential to the highly doped P type region; and a third potential source for applying a variable potential, having first and second levels, to the at least one second region, said third potential in its first level being insufficiently negative with respect to the level of said first potential source to establish a potential difference for forward biasing said PN junction thereby inhibiting current flow between said first, second, and third potentials, said third potential in its second level being selectively more negative with respect to said first potential source to establish a sufficient potential difference for forward biasing said PN junction thereby injecting electrons into said lightly doped P type region and lowering its resistivity;

whereby current flow is maintained from said first potential source through at least a portion of said first and second semiconductor regions to said third potential source after said third potential source is brought to its first level.

11. An integrated circuit semiconductor storage array as in claim 10 wherein said first potential source is connected to the at least one of said plurality of word lines, said second potential source is connected to the highly doped portion of the first semiconductor region by means of a resistive coupling through the substrate, and said third potential source is connected to the at least one of said plurality of bit lines.

12. An integrated circuit semiconductor storage array as in claim 10 wherein said first potential source is connected to a first one said at least one of said plurality of word lines, said second potential source is connected to the highly doped portion of the first semiconductor region by means of a polycrystalline resistor, and said third potential source is connected to the at least one of said bit lines, further comprising:
a second one of said plurality of word lines coupling a fourth potential source to the lightly doped portion of said first semiconductor region.

13. An integrated circuit semiconductor storage array as in claim 10 wherein said first potential source applies a relatively positive potential to the lightly doped portion of said first semiconductor region through an additional highly doped P type region adjacent thereto and spaced apart from said highly doped portion of said first semiconductor region, the second potential source being connected to said highly doped portion of said first semiconductor region, further comprising:
third and fourth N type semiconductor regions formed in proximity to said at least one second semiconductor region and in a drain/source relationship therewith; and
a gating electrode formed over portions of said second, third and fourth semiconductor regions;

said third potential being applied to said second region by means of fourth, fifth, and sixth potentials selectively applied to said third and fourth regions and said gate electrode.

14. An integrated circuit semiconductor storage array as in claim 1 wherein said first region is a quasi-base region, said second region is an emitter region and further comprising:

a collector region buried between said quasi-base region and said substrate.

* * * * *